United States Patent

Miyazaki et al.

[11] Patent Number: 5,532,062
[45] Date of Patent: *Jul. 2, 1996

[54] LOW EMISSIVITY FILM

[75] Inventors: Masami Miyazaki; Eiichi Ando, both of Yokohama, Japan

[73] Assignee: Asahi Glass Company Ltd., Tokyo, Japan

[*] Notice: The term of this patent shall not extend beyond the expiration date of Pat. No. 5,413,864.

[21] Appl. No.: 305,812

[22] Filed: Sep. 14, 1994

Related U.S. Application Data

[63] Continuation of Ser. No. 996,062, Dec. 23, 1992, abandoned, which is a continuation-in-part of Ser. No. 799,306, Nov. 27, 1991, Pat. No. 5,419,969, which is a continuation-in-part of Ser. No. 726,263, Jul. 5, 1991, Pat. No. 5,413,864.

[30] Foreign Application Priority Data

| Jul. 5, 1990 | [JP] | Japan | 2-176282 |
| Nov. 27, 1990 | [JP] | Japan | 2-321273 |
| Nov. 29, 1990 | [JP] | Japan | 2-325914 |
| Jul. 5, 1991 | [JP] | Japan | 3-191063 |
| Dec. 26, 1991 | [JP] | Japan | 3-357810 |
| Sep. 9, 1992 | [JP] | Japan | 4-266689 |

[51] Int. Cl.$^6$ .................................................... B32B 15/04
[52] U.S. Cl. .................... 428/432; 428/212; 428/433; 428/472; 428/697; 428/699; 428/702; 359/350; 359/360; 359/577; 359/580; 359/581; 359/582; 359/585; 359/586
[58] Field of Search .................................. 428/212, 426, 428/432, 688, 689, 697, 699, 702, 433, 472; 359/350, 360, 577, 580, 581, 582, 585, 586

[56] References Cited

U.S. PATENT DOCUMENTS

| 2,825,687 | 3/1958 | Preston | 204/192.29 |
| 4,336,120 | 6/1982 | Sakakura | 428/432 |
| 4,462,883 | 7/1984 | Hart | 428/621 |
| 4,462,884 | 7/1984 | Gillery | 428/630 |
| 4,565,719 | 1/1986 | Phillips | 428/34 |
| 4,859,532 | 8/1989 | Oyama | 428/336 |
| 4,971,843 | 11/1990 | Michelotti | 428/34 |
| 5,413,864 | 5/1995 | Miyazaki | 428/432 |

FOREIGN PATENT DOCUMENTS

| 0183052 | 6/1986 | European Pat. Off. . |
| 0332717 | 9/1989 | European Pat. Off. . |
| 0335769 | 10/1989 | European Pat. Off. . |
| 0336257 | 10/1989 | European Pat. Off. . |
| 0464789 | 1/1992 | European Pat. Off. . |
| 0448048 | 6/1992 | European Pat. Off. . |
| 0488048 | 6/1992 | European Pat. Off. . |
| 2586245 | 2/1987 | France . |

OTHER PUBLICATIONS

Database WPI, Derwent Publications, AN–84–059082, JP-A-59-018134, Jan. 30, 1984.
Database WPI, Derwent Publications, AN–89–003563, JP-A-63-281204, Nov. 17, 1988.
WPIL, AN 84'059802, Week 10, Jan. 30, 1984, & JP-A-59-018 134, "Sputter Formed Laminate Which Reflects Heat Rays—Consists Of Oxide–Metal–Oxide Structure Incorporating Difficultly Oxidisable And Easily Oxidisable Metals".
WPIL, AN 89–003563, Week 8910, Nov. 17, 1988, & JP-A-63-281 204, "Forming Iron–Silicon–Aluminium Alloy Film On Magnetic Head—In Two Stages With Intermediate Heat Treatment".

*Primary Examiner*—Ellis P. Robinson
*Assistant Examiner*—Timothy M. Speer
*Attorney, Agent, or Firm*—Oblon, Spivak, McClelland, Maier & Neustadt

[57] ABSTRACT

A low emissivity film comprises a coating of an oxide film, a metal film, an oxide film and so on alternately formed on a substrate in this order in a total of (2n+1) layers where n is an integer being equal to or more than 1, wherein an oxide film (B) formed on the side opposite to a metal film (A) being most remote from the substrate in view from the substrate, contains at least one layer of a zinc oxide film doped with at least one selected from the group consisted of Si, Ti, Cr, B, Mg, Sn and Ga by 1 through 10 atomic % with respect to a total amount including Zn.

21 Claims, 2 Drawing Sheets

LOW EMISSIVITY FILM

This application is a Continuation of application Ser. No. 07/996,062, filed on Dec. 23, 1992, now abandoned, which is a continuation in part of application Ser. No. 07/799,306 filed Nov. 27, 1991, now U.S. Pat. No. 5,419,969, which is a continuation in part of application Ser. No. 07/726,263, filed Jul. 5, 1991 now U.S. Pat. No. 5,413,864.

BACKGROUND OF THE INVENTION

1. Field of the Invention

The present invention relates to a low emissivity film which is excellent in moisture resistance.

2. Discussion of Background

A film composed of (2n+1) layers (n≧1) such as a film composed of three layers in which an oxide film, an Ag film, and an oxide film are successively coated on a surface of a substrate, or a film composed of five layers in which an oxide film, an Ag film, an oxide film, an Ag film and an oxide film are successively coated on a surface of a substrate, is a heat mirror film called Low-E (Low-Emissivity) film. A glass in which such a low-E film is formed, is called a Low-E glass.

This glass is a functional glass which can prevent lowering of room temperature by reflecting the thermal infrared radiation emitted from within a heated room, which is mainly used in cold district for the purpose of decreasing heating load. Furthermore, since this glass has a heat insulating effect of the solar radiation energy, it is adopted in a windshield of an automobile. Since this glass is transparent and is electrically conductive, it has a utility as an electromagnetic shielding glass. When this glass is equipped with an electric heating means such as a bus bar composed of an electrically conductive printing or the like, this glass can be used as an electrically heated window.

As a major Low-E glass, one having a film composition of ZnO/Ag/ZnO/glass, is pointed out. However, since such a film is devoid of durability such as scratch resistance or chemical stability, it cannot be employed in a form of single plate and it is necessary to employ it in a form of double glazing or laminated glass. Especially it has a problem in moisture resistance, wherein white dot or white turbidity is caused by moisture in the air or by moisture contained in an intermediate film in case of the laminated glass. Therefore, caution is required in the storage or in handling thereof in the form of single plate.

A detailed investigation on the deteriorated portion of the conventional Low-E glass (film composition: ZnO/Ag/ZnO/glass) reveals that damage of the film such as wrinkle, or crack, or exfoliation takes place on the outermost layer of the oxide film. Furthermore, it is found that considerable grain growth of Ag takes place. From these facts, the mechanism of the generation of the white turbidity is found to be as follows. The outermost layer of the oxide film can not resist with internal stress of the film, is exfoliated from an interface with an Ag film, and is destroyed. Next the grain size of Ag increases. Light is scattered by the destroyed surface and the large Ag grain, which causes the white turbidity in appearance.

Therefore, the inventors found that decreasing the internal stress of the oxide film, as a measure for improving the moisture resistance, is extremely effective. (described in Japanese Patent Application No. 191063/1991 By this measure, the durability of the film is considerably improved. However, it is necessary to further enhance it.

SUMMARY OF THE INVENTION

It is an object of the present invention to solve the above drawbacks of the conventional technology and to provide a low emissivity film which is excellent in the moisture resistance.

According to an aspect of the present invention, there is provided a low emissivity film comprising:

a coating of an oxide film, a metal film, an oxide film and so on alternately formed on a substrate in this order in a total of (2n+1) layers where n is an integer being equal to or more than 1, wherein an oxide film (B) formed on the side opposite to a metal film (A) being most remote from said substrate in view from the substrate, contains at least one layer of a zinc oxide film doped with at least one selected from the group consisted of Si, Ti, Cr, B, Mg, Sn and Ga by 1 through 10 atomic % with respect to a total amount including Zn, preferably 2 through 6 atomic %.

According to another aspect of the present invention, there is also provided a low emissivity film formed on a substrate which comprises: a coating of oxide films and films whose major component is Ag alternately formed on the substrate in a total of (2n+1) layers where n is an integer being equal to or more than 1, with a layer closest to the substrate being an oxide film, wherein an integral width $\beta i(°)$ of (111) diffraction line of a cubic Ag in an X-ray diffraction diagram of the low emissivity film exists in a first range of $180\lambda/(d\pi\cos\theta) \leq \beta i \leq 180\lambda/(d\pi\cos\theta)+0.15$, where $d(\text{Å})$ designates a thickness of a film whose major component is Ag, $\lambda(\text{Å})$, a wave length of an X-ray for measurement and $\theta$, Bragg angle.

A more preferable range of the integral width $\beta i(°)$ of (111) diffraction line of a cubic Ag is $180/(d\pi\cos\theta) \leq \beta i \leq 180\lambda/(d\pi\cos\theta)+0.10$.

The most preferable range of the integral width $\beta i(°)$ is $180/(d\pi\cos\theta) \leq \beta i \leq 180\lambda/(d\pi\cos\theta)+0.05$.

An Explanation will be given to the oxide film (B) of this invention as follows.

As stated above, in case of the conventional low emissivity glass (film composition: ZnO/Ag/ZnO/glass), when it is left in room in a form of single plate, white dot or white turbidity is caused by the moisture in the air. By observing the film having the white dot or white turbidity by a scanning electron microscope (SEM), presence of crack or wrinkle and presence of exfoliation of film is confirmed on the surface of the film.

When an elemental analysis is performed on respective elements of Ag and Zn, with respect to the portion of the exfoliation of film, although Ag is present by almost a constant amount irrespective of the presence or the absence of the exfoliation, the detected quantity of Zn is approximately halved at the exfoliated portion. Accordingly, it is found that the exfoliation takes place at an interface between the outermost ZnO layer and Ag layer.

Next, a sample was investigated by the X-ray diffraction method using CuKα radiation before and after a moisture resistance test (wherein the sample is left for six days in an atmosphere of 50° C. and the relative humidity of 95%). Concerning (002) diffraction line of hexagonal zinc oxide and (111) diffraction line of cubic Ag, each of diffraction angle 2θ (center of gravity position of peak), interplanar spacing d and integral width I.W. is shown in Table 1.

It is possible to detect the degree of lattice strain caused by an internal stress by the degree of the deviation of the peak in the X-ray diffraction method. In case of a sample having the film composition of ZnO (B)/Ag/ZnO (A)/glass, the peak of the outermost layer of ZnO (B) is detected by an intensity 5 through 15 times as much as the peak of ZnO (A). Therefore, the peak of ZnO in a total of the sample by the X-ray diffraction method may be influenced by ZnO (A) more or less, it may be construed that the peak is the peak of the outermost layer of hexagonal ZnO (B).

TABLE 1

|  | (002) diffraction line of ZnO | | (111) diffraction line of Ag | |
| --- | --- | --- | --- | --- |
|  | Before moisture resistance test | After moisture resistance test | Before moisture resistance test | After moisture resistance test |
| 2θ (deg.) | 33.78 | 33.91 | 38.09 | 38.09 |
| d (Å) | 2.650 | 2.641 | 2.361 | 2.361 |
| I.W. (deg.) | 0.510 | 0.623 | 0.977 | 0.675 |

It is found from Table 1, the position of (002) diffraction line of the low emissivity film before the moisture resistance test is considerably deviated as compared to 2θ=34.44° of ZnO powder. This insinuates the presence of a crystal strain. This crystal strain is considered to be due to an internal stress of the film. In the sample before the moisture resistance test, the interplanar spacing $d_{002}$=2.650 Å, which is larger than that of ZnO powder $d_{002}$=2.602 ÅA, by 1.8%. This reveals that the crystal receives a large compressive stress. In a sample after the moisture resistance test, $d_{002}$= 2.641 Å, wherein the crystal strain decreases a little. This corresponds with that the internal stress of the outermost layer of hexagonal ZnO is partially alleviated by crack, wrinkle or exfoliation.

Concerning (111) diffraction line of Ag, since the integral width after the moisture resistance test decreases, it is considered that particles of Ag grow by performing the moisture resistance test.

That is to say, the mechanism of generation of white turbidity, is considered to be that the outermost layer of ZnO film can not stand the internal stress, exfoliated from the interface thereof with the Ag film and damaged, and silver is deteriorated, or the particle size thereof increases, light is scattered by the damaged surface and by the large silver particles and the surface looks turbid. In the example of Table 1, the internal stress is a compressive stress. However, there are two kinds of internal stress, namely, a compressire stress and a tensile stress, both of which cause the damage of film.

It was found from the above observation that the decrease of internal stress of the outermost layer of ZnO film is effective to restrain the white turbidity due to the moisture.

In this invention, it was found that the internal stress can be decreased and the moisture resistance of the low emissivity film can be improved by doping at least one selected from the group consisted of Si, B, Ti, Mg, Cr, Sn and Ga to zinc oxide.

Table 2 shows the internal stress of a single layer (450 Å) of the oxide film (B), and a relationship between diffraction angle 2θ (center of gravity position) of (002) diffraction line of the hexagonal zinc oxide of a low emissivity film wherein a similar oxide film (B) (450 Å) is formed on glass/ZnO (450 Å)/Ag (100 ÅA) by a sputtering method, and the moisture resistance of the low emissivity film.

TABLE 2

|  | Oxide film (B) 450Å | | Oxide film (B)/Ag/ZnO/ glass 450Å/100Å/450Å | |
| --- | --- | --- | --- | --- |
|  | Material | Internal stress # (dyn/cm$^2$) | Diffraction angle 2θ (degree) of (002) diffraction line of ZnO | Moisture resistance |
| 1 | ZnO | $1.5 \times 10^{10}$ | 33.78 | Δ |
| 2 | Si doped ZnO | $7.8 \times 10^9$ | 33.99 | ○ |
| 3 | Ti doped ZnO | $4.6 \times 10^9$ | 34.21 | ○ |
| 4 | Cr doped ZnO | $6.1 \times 10^9$ | 34.12 | ○ |
| 5 | Mg doped ZnO | $7.9 \times 10^9$ | 33.99 | ○ |
| 6 | B doped ZnO | $9.5 \times 10^9$ | 33.89 | ○ |
| 7 | Sn doped ZnO | $5.7 \times 10^9$ | 34.18 | ○ |
| 8 | Ga doped ZnO | $8.0 \times 10^9$ | 33.96 | ○ |
| 9 | Ca doped ZnO | $2.3 \times 10^{10}$ | 33.65 | X |
| 10 | Ba doped ZnO | $2.0 \times 10^{10}$ | 33.67 | X |

Internal stresses are all compressive.

The moisture resistance is evaluated by performing a test wherein the sample is left for six days in an atmosphere of 50° C. and the relative humidity of 95%. The criterion for evaluation is as follows. ○ is for no white turbidity in the vicinity of edge portions of the film and no white dot having a diameter not smaller than 1 mm. Δ is for white turbidity in the vicinity of edge portions of the film, or white spot having a diameter not smaller than 1 mm. X is for white turbidity all over the film. All of the doping quantities of Si, B, Ti, Mg, Cr, Sn, Ga, Ca and Ba are 4% in atomic ratio with respect to a total quantity including Zn.

According to Table 2, the internal stress of the zinc oxide film is lowered when the zinc oxide film is doped with any one of Si, B, Ti, Mg, Cr, Sn and Ga. The moisture resistance of the low emissivity film employing the zinc oxide film doped with these various elements, is improved. In this case, compared with the ones not doped with these elements, the diffraction angle 2θ (center of gravity position) of (002) diffraction line of ZnO, is shifted to the side of a higher angle. This implies that the crystal strain thereof is smaller than that of the one not doped with these elements, which supports that the internal stress of the film thereof is small.

Figure 1A:
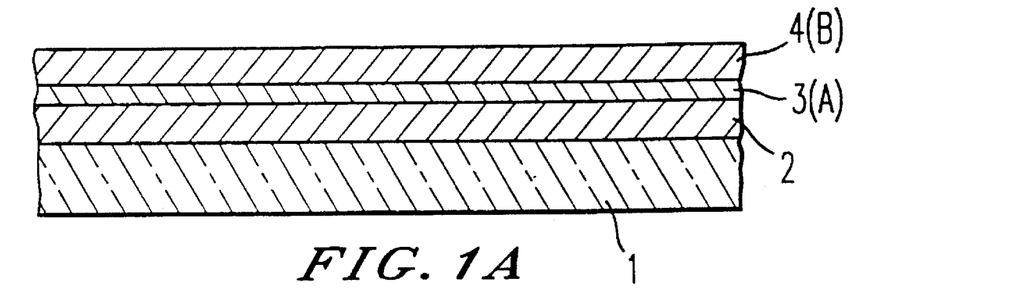
FIGS. 1A and 1B are sectional diagrams of an example of a low emissivity glass coated with a low emissivity film on the glass according to the present invention.
Figure 1B:
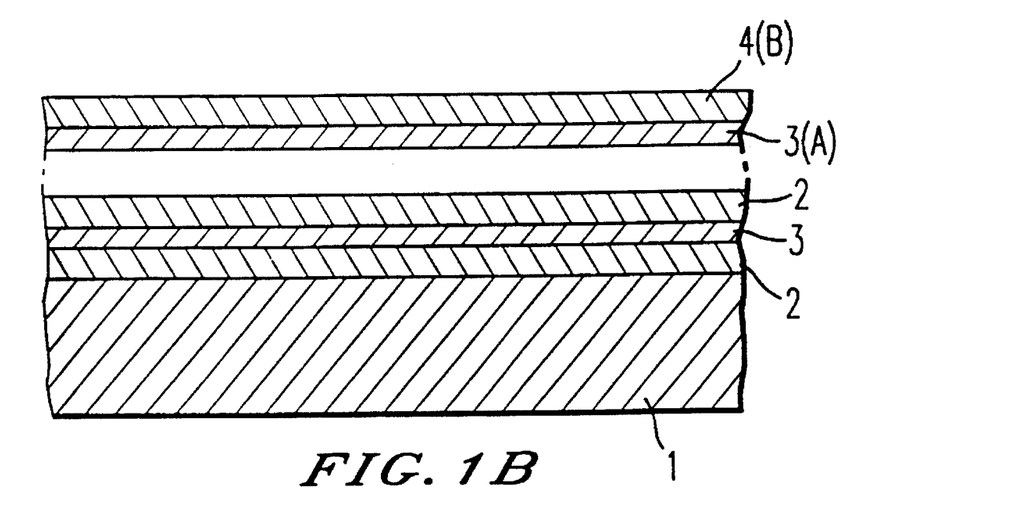

FIGS. 1A and 1B show sectional diagrams of representative Examples of the low emissivity film of this invention. FIG. 1A is a sectional diagram of a low emissivity film composed of three layers and FIG. 1B, a sectional diagram of a low emissivity film composed of (2n+1) layers. A reference numeral 1 designates a substrate, 2, an oxide film, 3(A), a metal film and 4(B), an oxide film (B) containing at least one layer of a zinc oxide film doped with at least one selected from the group consisted of Si, Ti, Cr, B, Mg, Sn and Ga.

As the substrate 1 in this invention, other than glass plate, film or plate of plastics or the like, can be employed.

The oxide film (B) contains at least one layer of a zinc oxide film doped with at least one selected from the group consisted of Si, Ti, Cr, B, Mg, Sn and Ga. When the doping quantity of these elements is smaller than 1 atomic %, the internal stress is not considerably decreased, which does not amount to the improvement of the moisture resistance. When the doping quantity exceeds 10 atomic %, the effect of decreasing the internal stress does not vary considerably. Furthermore, when the doping quantity is large, "haze" is apt to be brought about by the moisture, which deteriorates the moisture resistance all the more. Furthermore, the larger the quantity of addition, the slower the film forming rate, which deteriorates the productivity. In consideration of above observation, the optimum doping quantity is 1 through 10 atomic % with respect to a total quantity including Zn, and preferably 2 through 6 atomic %.

As stated above, with respect to the ZnO film constituting the oxide film (B), the internal stress of the hexagonal zinc oxide approximately corresponds with the diffraction angle 2θ (center of gravity position) by the X-ray diffraction method using CuKα radiation. The crystal system of a film whose major component is zinc oxide is hexagonal. To promote the moisture resistance of the low emissivity film of this invention, in the X-ray diffraction of the low emissivity film using CuKα radiation, the diffraction angle 2θ (center of gravity position) of (002) diffraction line of the hexagonal zinc oxide, is preferably a value in a range of 33.88° through 35.00° particularly 34.00° through 34.88°. The value of the diffraction angle 2θ of not larger than 34.44° indicates a compressive stress and the value thereof of not smaller than 34.44°, a tensile stress.

The film thickness of the oxide film (B) is not particularly restricted. However, in consideration of the color tone, the visible light transmittance of a total of the low emissivity film, a thickness of 200 through 700 Å is preferable.

The oxide film (B) may be of a multi-layer. For instance, in case of forming a double glazing by laminating the low emissivity film with another substrate through a plastic intermediate film with the low emissivity film of this invention on the inner side, an oxide film (for instance, a chromium oxide film), a film composed of an oxide doped with other elements, a composite oxide film or the like having a thickness of not larger than 100 Å, may be formed as a layer contacting the intermediate film for the purpose of controlling an adhesive strength therebetween or promoting the durability. The oxide film (B) may be composed of two layers or more including such a layer.

In case of forming the oxide film (B) in an atmosphere containing oxygen by a reactive sputtering, to prevent oxidation of the metal film (A), first, a thin metal film or a not-sufficiently-oxidized metal oxide film is preferably formed on the metal film (A) in an atmosphere having poor oxygen. This thin metal film is oxidized and becomes an oxidized film in forming the oxidized film (B). Accordingly, the preferable oxide film thickness of the above-mentioned oxide film (B) is that including the film thickness of the oxide film which is formed by oxidizing the thin metal film. In this specification, the same is applicable to an oxide film formed on the metal film 3.

The material of the oxide film 2, other than the oxide film (B), is not particularly restricted. A multi-layer film containing at least two selected from the group consisted of ZnO, SnO₂ and TiO₂, or the multi-layer film added with other elements or the like can be employed. Furthermore, in consideration of the productivity, a film alternately laminated with at least two layers of the group consisted of ZnO, SnO₂ and ZnO-SnO₂, or a ZnO film doped with at least one selected from the group consisted of Si, B, Ti, Mg, Cr, Sn and Ga by a total of 10 atomic % or less with respect to a total quantity including Zn, is preferable.

Considering the color tone and the visible light transmittance, the thickness of the oxide film 2 is preferably 200 Å through 700 Å. In case of a multi-layer film, a total thereof is preferably 200 Å through 700 Å, and the film thicknesses of the respect layers are not to be limited.

Particularly, in case of a low emissivity film having a film composition of five layers as in that of an oxide film, a metal film, an oxide film, a metal film and an oxide film, or more than five layers, it is preferable to employ a film including at least one layer of a zinc oxide film doped with at least one of the group consisted of Si, B, Ti, Mg, Cr, Sn and Ga by 1 through 10 atomic %, preferably 2 through 6 atomic % with respect to a total quantity including Zn, in the oxide film 2 other than the outermost layer of the oxide film (B).

As the metal film 3 in this invention, a film provided with the heat ray shielding function such as a film of Ag or a film whose major component is Ag including at least one selected from the group consisted of Au, Cu and Pd, can be employed. The metal film 3 may be provided with a metal layer having various functions other than the metal film having the heat ray shielding function. For instance, a metal layer which controls an adhesive strength between the metal film having the heat ray shielding function, and the oxide film (B) or the oxide film 2, a metal layer having a function preventing diffusion of metal from the metal film having the heat ray shielding function or the like, may be pointed out. As an example of a metal composing the metal layers having these functions, Zn, Al, Cr, W, Ni, Ti, or an alloy having two kinds of these or the like, is pointed out.

The moisture resistance can further be improved by combining the oxide film 4 having low internal stress, with the Ag layer.

Explanation will be given in details in the following on the relationship between the stability of Ag and the deterioration of the Low-E film.

A moisture resistance test was performed on a conventional Low-E film (ZnO/Ag/ZnO/glass). In this moisture resistance test, the sample is left in an atmosphere of 50° C. in temperature and 95% in relative humidity for 6 days. White dots and white turbidity are found in the Low-E film after the moisture resistance test. Investigation is performed on the Low-E film before and after the moisture resistance test by X-ray diffraction method. Table 3 shows respectively the diffraction angle 2θ (center of gravity position of X-ray diffraction peak), the interplanar spacing $d_{111}$, and the integral width βi, concerning (111) diffraction line of cubic Ag.

TABLE 3

|  | Before moisture test | After moisture test |
|---|---|---|
| 2θ (°) | 38.09 | 38.09 |
| $d_{111}$ (Å) | 2.361 | 2.361 |
| βi (°) | 0.977 | 0.675 |

According to Table 3, concerning (111) diffraction line of Ag, after the moisture resistance test, the integral width βi is decreased to a large extent, and the diffraction peak becomes considerably sharp. This shows that the crystallite size of Ag is considerably increased. (That is, the crystallite size becomes larger than the film thickness.) The increase of the grain size and the agglomeration of Ag is recognized by the observation of the sample by a SEM (scanning electron microscope) of the Low-E film after the moisture resistance test. In this specification, crystallite designates a crystal particle recognized by an X-ray, and grain designates a particle aggregated with the crystallite recognized by an SEM. From this observation, it is found that the Ag film is changeable and unstable.

The Low-E film is liable to be deteriorated due to the instability of such Ag. This is due to the following two reasons.

First of all, exfoliation of the oxide film is liable to take place at the interface between Ag and the oxide, and the outermost layer of the oxide film is liable to be destroyed. The portion wherein the oxide film is exfoliated and destroyed appears to be the white turbidity. (This phenomena is naturally significant when the internal stress of the oxide film is large. The fact that the deterioration can be prevented by lowering the internal stress of the oxide film, was mentioned in details in Japanese Patent Application No. 191063/1991).

Secondly, in addition to the destruction of the oxide film, the grain growth of Ag and the agglomeration thereof take place, by which the degree of white turbidity becomes more and more conspicuous. This is also due to the instability of Ag.

When Ag is stabilized, exfoliation of the oxide film is hard to take place at the interface between Ag and the oxide. Therefore, the destruction of the outermost layer of the oxide film is hard to take place. Even when the outermost layer of the oxide film is exfoliated, the degree of the white turbidity is not so conspicuous since the grain of Ag does not considerably grow and agglomerate. As a result the deterioration of the Low-E film is prevented.

From above reasonings, it is found that the stabilization of Ag is indispensable for improving the durability of the Low-E film.

A search is performed by observing the X-ray diffraction line, on the imperfection of Ag crystal, and the relationship between the stability of Ag and the observation result is mentioned as follows.

Scherrer introduced the following experimental formula concerning a general crystal, assuming that there is no imperfection in crystal and the spacing of the profile depends only on the crystallite size, and presuming that the crystallite size is uniform.

$$D_{hkl}=K \cdot 180\lambda/(\pi\beta i \cos\theta)$$

where $D_{hkl}$ (Å) is a crystallite size perpendicular to hkl, K, a constant, $\lambda$(Å), an X-ray wave length for measurement, $\beta i$ (°), an integral width, and $\theta$, a Bragg angle of a diffraction angle (2$\theta$ is peak position). When $\beta i$ signifies the integral width, K is about 1.

Generally speaking, an Ag film coated by a sputtering method is liable to be oriented in (111) plane parallel to the substrate. Accordingly, normally, only (111) diffraction line of Ag is observed.

When Ag is a perfect crystal in the direction perpendicular to the substrate, the crystallite size in the direction perpendicular to the substrate is the same as the film thickness. In case of the above (111) plane oriented in parallel to the substrate, the crystallite size $D_{111}$ is equal to the film thickness. Therefore, the film thickness and the integral width are defined by the following equation.

$$d=D_{111}=180\lambda/(\pi\beta i \cos\theta)$$

Therefore, $$\beta i=180\lambda/(d\pi\cos\theta) \quad (1)$$

Figure 2:
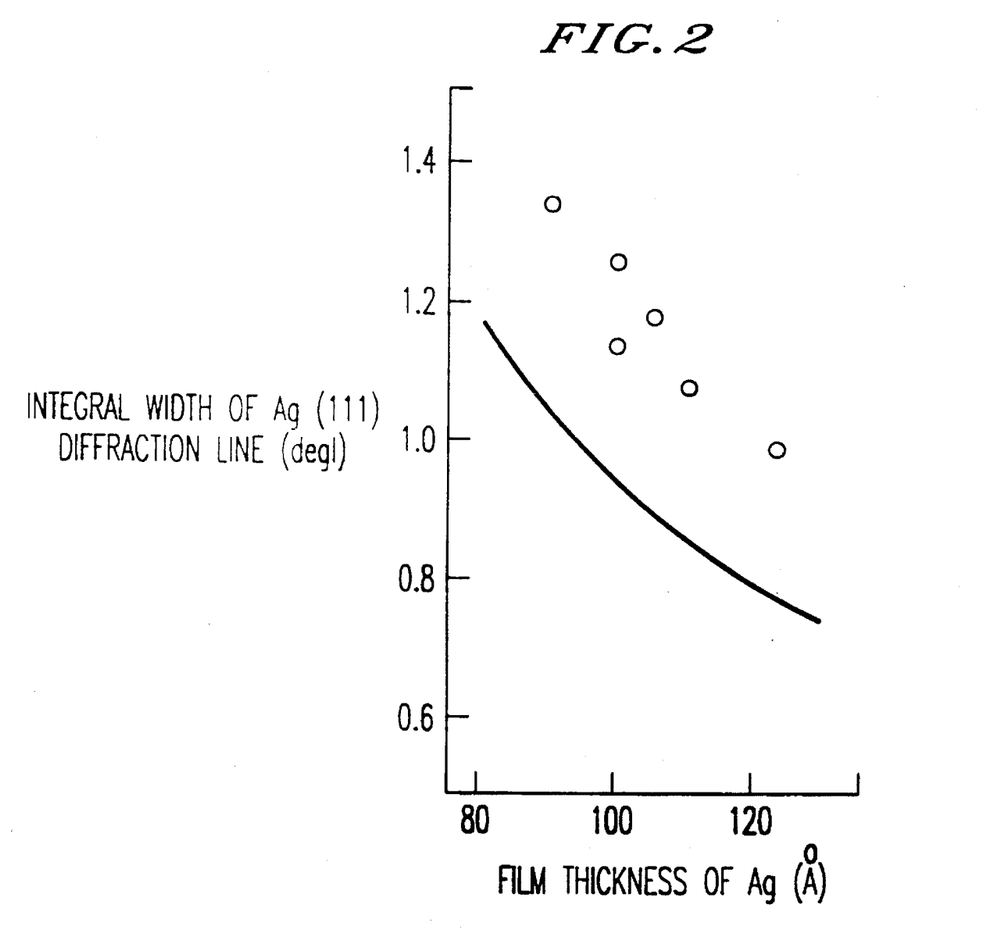
FIG. 2 is a graph showing a relationship between a film thickness of Ag and an integral width of Ag (111) diffraction line.

FIG. 2 shows the relationship between the film thickness of Ag and the integral width of (111) diffraction line of Ag. The bold line shows the relationship as shown in equation (1). Each dot signifies a measured value in the conventional ZnO/Ag/ZnO/glass.

When Ag is of a perfect crystal in the direction perpendicular to the substrate, the integral width of (111) diffraction line of Ag should approximately agree with the bold line in FIG. 2. However, FIG. 2 shows that the measured value of the integral width of the conventional Low-E film are larger than that of the bold line.

The main reason that integral width is enlarged, is that the Ag crystal is not a perfect crystal, and contains imperfection such as ununiform distortion or defect.

Due to the imperfection of the crystal, Ag becomes unstable then oxide film is liable to be exfoliated and the grain growth of Ag is liable to take place. As the result, the moisture resistance of the Low-E film is deteriorated, and white turbidity or white dot is generated.

In this invention, it is found that alleviation of the imperfection of the Ag crystal is effective for preventing the white turbidity or the white dot due to moisture.

Table 4 shows the relationship among the integral width $\beta i$ of (111) diffraction line of cubic Ag of the Low-E film before the moisture resistance test, the ratio of change of integral width of the Low-E film after the moisture resistance test in comparison to the integral width before the moisture resistance test, and the moisture resistance. Every uppermost layer of the ZnO film and every Ag film are produced under the same condition. The film thickness of the Ag film is 100 Å. The internal stress of the uppermost layer of ZnO film is $1.2 \times 10^{10}$ dyn/cm². In samples 3, heat treatment at 200° to 300° C. is performed after the film deposition. When the samples are investigated by X-ray diffraction method, almost no change is found on the peak position of (002) diffraction line of hexagonal ZnO before and after the heat treatment. From this fact, it seems that there is almost no change in the internal stress of ZnO film.

The moisture resistance of sample is evaluated by performing the test in which the sample is left in an atmosphere of 50° C. in temperature and 95% in relative humidity for 6 days. As the evaluation standard, o is for a sample having no white turbidity at adjacent to the edge of the film, and white dot with a diameter less than 1 mm or no white dot, Δ for a sample having no white turbidity at adjacent to the edge of the film, and white dot with a diameter of 1 to 2 mm, and X for a sample having white turbidity at adjacent to the edge of the film, or white dot with a diameter of more than 2 mm.

From Table 4, it is found that the moisture resistance depends on the integral width $\beta i$ of (111) diffraction line of cubic Ag of the Low-E film before the moisture resistance test.

TABLE 4

| | Layer system of Low-E film (numerals: film thickness (Å)) | Integral width (°) of Ag (111) diffraction line | Ratio of change of integral width of Ag (111) diffraction line (%) | Moisture resistance |
| --- | --- | --- | --- | --- |
| 1 | ZnO/Ag/G 450 100 | 1.75 | 63.5 | x |
| 2 | ZnO/Ag/ZnO/G 450 100 450 | 1.12 | 14.4 | Δ |
| 3 | ZnO/Ag/ZnO/G 450 100 450 | 0.95 | 0.3 | o |

When the integral width is small and approximately equal to 0.93 which is a value calculated from equation (1) when the film thickness of Ag is 100 Å, that is, when the crystallite size in the direction perpendicular to the substrate is approximately equal to the film thickness (that is, imperfection of crystal is not considerable), the change of (111) diffraction line of Ag after the moisture resistance test in comparison to that of before the test is small and Ag is stable. Normally, since the crystallite size in the direction perpendicular to the substrate varies with the film thickness of Ag, naturally, so does the integral width. Accordingly, the optimum value of the integral width of Ag crystal changes with the film thickness of Ag. Table 5 shows the relationship between the integral width of (111) diffraction line of cubic Ag and the moisture resistance when the film thickness of Ag in the Low-E film (ZnO/Ag/ZnO/glass), is changed. The evaluation standard of the moisture resistance is the same as in the above Table 4.

TABLE 5

| Film thickness of Ag (Å) | Integral width (°) | Moisture resistance |
|---|---|---|
| 90 | 1.34 | X |
|  | 1.20 | Δ |
|  | 1.05 | O |
|  | (1.03) |  |
| 100 | 1.25 | X |
|  | 1.12 | Δ |
|  | 0.95 | O |
|  | (0.93) |  |
| 110 | 1.07 | X |
|  | 1.01 | Δ |
|  | 0.84 | O |
|  | (0.84) |  |

The values in the parentheses in Table 5 are the values wherein the peak position 2θ=38.11 of (111) diffraction line of Ag powder in case of X-ray diffraction by CuKα radiation (λ=1.54 Å), is put into the equation (1).

In the Low-E film according to the present invention, the integral width βi(°) of (111) diffraction line of cubic Ag in the X-ray diffraction diagram of the Low-E film, is desirable to be in the range of $180\lambda/(d\pi\cos\theta) \leq \beta i \leq 180\lambda/(d\pi\cos\theta)+0.15$, more preferably, $180\lambda/(d\pi\cos\theta) \leq \beta i \leq 180\lambda/(d\pi\cos\theta)+0.10$ and the most preferably, $180\lambda/(d\pi\cos\theta) \leq \beta i \leq 180\lambda/(d\pi\cos\theta)+0.05$, where d(Å) designates the thickness of the Ag layer 3 whose major component is Ag, λ (Å), the wave length of the X-ray for measurement, and θ, Bragg angle (2θ is peak position).

As the film thickness of a total of the metal film 3 including these metal layers, in consideration of a balance of the heat ray shielding function and the visible light transmittance and the like, a thickness of 50 Å through 160 Å, especially around 90 Å through 120 Å, is suitable.

The moisture resistance of the invented low emissivity film is considerably improved, compared with the conventional low emissivity film, by including at least one layer of a zinc oxide film doped with at least one selected from the group consisted of Si, Ti, Cr, B, Mg, Sn and Ga by 1 through 10 atomic %, preferably 2 through 6 atomic % with respect to a total quantity including Zn, as the oxide film (B). This is because the deterioration by the moisture is restrained since the oxide film is hard to be destroyed by lowering the internal stress of the oxide film.

DETAILED DESCRIPTION OF THE PREFERRED EMBODIMENTS

Now, the present invention will be described in further detail with reference to Examples. However, it should be understood that the present invention is by no means restricted to such specific Examples.

EXAMPLE 1

A Si doped ZnO film was formed by 450 Å, by a direct current sputtering method, on a glass substrate, in an atmosphere of $Ar:O_2=1:9$ under $2.0\times10^{-3}$ Torr, employing a target of a ZnSi metal containing Si by 3.0 atomic % with respect to a total quantity including Zn.

Next, an Ag film was formed by 100 Å in an atmosphere of Ar only under $2.0\times10^{-3}$ Torr, employing a target of Ag. Next, without changing the atmosphere, a Si doped Zn film of approximately 20 Å was formed employing a target of a metal added with Si by 3.0 atomic % with respect to a total quantity including Zn. Finally, a Si doped ZnO film was formed on the above Ag film in an atmosphere of $Ar:O_2=1:9$ under $2.0\times10^{-3}$ Torr, employing a target of a metal added with Si by 3.0 atomic % with respect to a total quantity including Zn.

Since the Si doped Zn film was oxidized into a Si doped ZnO film in the oxidizing atmosphere in forming the Si doped ZnO film, the total film thickness of the Si doped ZnO film formed on the Ag film, was 450 Å. The temperature of the substrate in forming the film is room temperature. The power density of sputtering was 2.7 W/cm² in forming the Si doped ZnO film and 0.7 W/cm² in forming the Ag film. The ratio of Si as compared to Zn in the Si doped ZnO film was the same with that of the target.

A moisture resistance test was performed on the low emissivity film, wherein the sample was left for six days in an atmosphere of 50° C. and the relative humidity of 95%. As for the appearance of the sample after the moisture resistance test, although very small white spots were observed, no conspicuous white dot and white turbidity were not observed and the result was good.

EXAMPLE 2

A Cr doped ZnO film was formed by 450 Å on a glass substrate by a direct current sputtering method, in an atmosphere of $Ar:O_2=1:9$ under $2.0\times10^{-3}$ Torr, employing a target of a ZnCr metal containing 3.0 atomic % of chromium with respect to a total quantity including Zn.

Next, an Ag film was formed by 100 Å, in an atmosphere of Ar only under $2.0\times10^{-3}$ Torr, employing a target of Ag. Next, without changing the atmosphere, a very thin Cr doped Zn film was formed by approximately 20 Å, employing a target of a metal added with Cr by 3.0 atomic with respect to a total quantity including Zn. Finally, a Cr doped ZnO film was formed on the Ag film, in an atmosphere of $Ar:O_2=1:9$ under $2.0\times10^{-3}$ Torr, employing a target of metal added with Cr by 3.0 atomic % with respect to a total quantity including Zn.

Since in forming the Cr doped ZnO film, a Cr doped Zn film was oxidized into a Cr doped ZnO film in the oxidizing atmosphere, the total film thickness of the Cr doped ZnO film formed on the Ag film was 450 Å. The temperature of the substrate in the film formation was room temperature. The power density of the sputtering was 2.7 W/cm² in forming the Cr doped ZnO film, whereas in forming the Ag film, the power density was 0.7 W/cm². Furthermore, the ratio of Cr as compared to Zn in the Cr doped ZnO film was the same with that of the target.

A moisture resistance test similar to the above Example was performed on the obtained low emissivity film. As for the appearance of the sample after the moisture resistance test was good, similar to that in the above Example.

EXAMPLE 3

A Ti doped ZnO film was formed by 450 Å on a glass substrate by a direct current sputtering method, in an atmosphere of $Ar:O_2=1:9$ under $2.0\times10^{-3}$ Torr, employing a target of a ZnTi metal containing Ti by 3.0 atomic % with respect to a total quantity including Zn.

Next, an Ag film is formed by 100 Å in an atmosphere of Ar only under $2.0 \times 10^{-3}$ Torr, employing a target of Ag. Next, without changing the atmosphere, a very thin Ti doped ZnO film is formed by approximately 20 Å, employing a target of a metal added with Ti by 3.0 atomic % with respect to a total quantity including Zn. Finally, a Ti doped ZnO film was formed on the Ag film, in an atmosphere of $Ar:O_2=1:9$ under $2.0 \times 10^{-3}$ Torr, employing a target of a metal added with Ti by 3.0 atomic % with respect to a total quantity including Zn.

Since, in forming the Ti doped ZnO film, a Ti doped Zn film is oxidized into the Ti doped ZnO film in the oxidizing atmosphere, the total film thickness of the Ti doped ZnO film formed on the Ag film was 450 Å. The temperature of the substrate in forming the film was room temperature. The power density of the sputtering was 2.7 $W/cm^2$ in forming the Ti doped ZnO film, whereas in forming the Ag film, the power density was 0.7 $W/cm^2$. Furthermore, the ratio of Ti as compared to Zn in the Ti doped ZnO film was the same with that of the target.

When a moisture resistance test similar to those in the above Examples was performed on the obtained low emissivity film, the appearance of the sample after the moisture resistance test was good, similar to those in the above Examples.

EXAMPLE 4

A Mg doped ZnO film is formed by 450 Å on a glass substrate by a direct current sputtering method, in an atmosphere of $Ar:O_2=1:9$ under $2.0 \times 10^{-3}$ Torr, employing a target of a ZnMg metal containing Mg by 3.0 atomic % with respect to a total quantity including Zn.

Next, an Ag film was formed by 100 Å, in an atmosphere of Ar under $2.0 \times 10^{-3}$ Torr. Next, without changing the atmosphere, a very thin Mg doped Zn film was formed by approximately 20 Å, employing a target of a metal added with Mg by 3.0 atomic % with respect to a total quantity including Zn. Finally, a Mg doped ZnO film was formed on the Ag film, in an atmosphere of $Ar:O_2=1:9$ under $2.0 \times 10^{-3}$ Torr, employing a target of metal added with Mg by 3.0 atomic % with respect to a total quantity including Zn.

Since the Mg doped Zn film is oxidized into a Mg doped ZnO film under the oxidizing atmosphere in forming the Mg doped ZnO film, the total film thickness of the Mg doped ZnO film formed on the Ag film was 450 Å. The temperature of the substrate in forming the film was room temperature. The power density of the sputtering was 2.7 $W/cm^2$ in forming the Mg doped ZnO film, and 0.7 $W/cm^2$ in forming the Ag film. Furthermore, the ratio of Zn as compared to Mg in the Mg doped ZnO film was the same with that of the target.

When a moisture resistance test similar to those in the above Examples is performed on the obtained low emissivity film, the appearance of the sample after the moisture resistance test was good, similar to those in the above Examples.

EXAMPLE 5

A B doped ZnO film was formed by 450 Å on a glass substrate, by a direct current sputtering method, in an atmosphere of $Ar:O_2=1:9$ under $2.0 \times 10^{-3}$ Torr, employing a target of a ZnB metal containing B by 3.0 atomic % with respect to a total quantity including Zn.

Next, an Ag film was formed by 100 Å, in an atmosphere of Ar only under $2.0 \times 10^{-3}$ Torr employing a target of Ag. Next, without changing the atmosphere, a very thin B doped Zn film was formed by approximately 20 Å employing a target of a metal added with B by 3.0 atomic % with respect to a total quantity including Zn. Finally, a B doped ZnO film was formed on the Ag film, in an atmosphere of $Ar:O_2$ is equal to 1:9 under $2.0 \times 10^{-3}$ Torr, employing a target of a metal added with B by 3.0 atomic % with respect to a total quantity including Zn.

Since the B doped Zn film was oxidized into a B doped ZnO film in the oxidizing atmosphere in forming the B doped ZnO film, the total film thickness of the B doped ZnO film formed on the Ag film was 450 Å. The temperature of the substrate in forming the film was room temperature. The power density of the sputtering was 2.7 $W/cm^2$ in forming the B doped ZnO film, and 0.7 $W/cm^2$ in forming the Ag film. Furthermore, the ratio of B as compared to Zn in the B doped ZnO film was the same with that of the target.

When a moisture resistance test similar to those in the above Examples was performed on the obtained low emissivity film, the appearance of the sample after the moisture resistance test was as good as those in the above Examples.

EXAMPLE 6

A Sn doped ZnO film was formed by 450 Å on a glass substrate, by a direct current sputtering method, in an atmosphere of $Ar:O_2=1:9$ under $2.0 \times 10^{-3}$ Torr, employing a target of a ZnSn metal containing Sn by 3.0 atomic % with respect to a total quantity including Zn.

Next, an Ag film was formed by 100 Å, in an atmosphere of Ar only under $2.0 \times 10^{-3}$ Torr. Next, without changing the atmosphere, a very thin Sn doped Zn film was formed by approximately 20 Å, employing a target of a metal added with Sn by 3.0 atomic % with respect to a total quantity including Zn. Finally, an Sn doped ZnO film was formed on the Ag film in an atmosphere of $Ar:O_2=1:9$ under $2.0 \times 10^{-3}$ Torr, employing a target of metal added with Sn by 3.0 atomic % with respect to a total quantity including Zn.

Since the Sn doped Zn film is oxidized into an Sn doped ZnO film in the oxidizing atmosphere in forming the Sn doped ZnO film, the total film thickness of the Sn doped ZnO film formed on the Ag film was 450 Å. The temperature of the substrate in forming the film was room temperature. The power density of the sputtering was 2.7 $W/cm^2$ in forming the Sn doped ZnO film, and 0.7 $W/cm^2$ in forming the Ag film. Furthermore, the ratio of Zn as compared to Sn in the Sn doped ZnO film was the same with that of the target.

When a moisture resistance test similar to those in the above Examples was performed on the obtained low emissivity film. The appearance of the sample after the moisture resistance test was as good as those in the above Examples.

EXAMPLE 7

A Ga doped ZnO film was formed by 450 Å on a glass substrate by a direct current sputtering method, in an atmosphere of Ar, employing a target of Ga doped ZnO containing Ga by 5.0 atomic % with respect to a total quantity including Zn. Next, without changing the atmosphere, an Ag film was formed by 100 Å employing a target of Ag. Finally, without changing the atmosphere, a Ga doped ZnO film was formed by 450 Å on the Ag film, employing a target of Ga doped ZnO containing Ga by 5.0 atomic %.

The temperature of the substrate in forming the film was room temperature. The power density of the sputtering was 1.1 W/cm² in forming the Ga doped ZnO film, and 0.7 W/cm² in forming the Ag film.

Furthermore, the ratio of Zn as compared to Ga in the Ga doped ZnO film was the same with that of the target.

A moisture resistance test similar to those in the above Examples was performed on the obtained low emissivity film. The appearance of the sample after the moisture resistance test was as good as in the above Examples.

EXAMPLE 8

A Ga-doped ZnO film, an Ag film, and a Ga-doped ZnO film are successively deposited on a glass substrate having respectively the thicknesses of 450 Å, 100 Å, and 450 Å, by the RF sputtering method. In this Example, the Ga-doped ZnO films are formed, as the oxide film 2 and the oxide film 4, and the Low-E film after the film formation is heat-treated in vacuum.

A ZnO target containing Ga by 5.0 atomic % of the total quantity including Zn and an Ag target are used, and the sputtering is performed in an atmosphere of argon gas. The substrate temperature is at room temperature. The film deposition of the Ga-doped ZnO films of the first and the third layers, is performed under the RF pressure of $1.0 \times 10^{-2}$ Torr, with the RF power density of 1.8 W/cm². The film deposition of the Ag layer is performed under the sputtering pressure of $3.0 \times 10^{-3}$ Torr, with the RF power density of 1.1 W/cm². The Low-E film after deposition is heat treated at 240° C. in vacuum for 1 hour.

The Low-E film after the heat treatment is examined by X-ray diffraction method. The integral width βi of (111) diffraction line of Ag is 0.95°. The diffraction angle 2θ (center of gravity position) of (002) diffraction line of ZnO is found to be 34.02°.

The appearance of the Low-E film after 6 days of the moisture resistance test, is excellent without any white dot or turbidity observed by human eyes.

COMPARATIVE EXAMPLE 1

A ZnO film was formed by 450 Å on a glass substrate by a direct current sputtering method, in an atmosphere of Ar:O₂=1:9 under $2.0 \times 10^{-3}$ Torr, employing a target of a Zn metal.

Next, an Ag film was formed by 100 Å in an atmosphere of Ar only under $2.0 \times 10^{-3}$ Torr, employing a target of Ag. Next, without changing the atmosphere, a very thin Zn film was formed by approximately 20 Å, employing a target of a Zn metal. Finally, a ZnO film was formed on the Ag film in an atmosphere of Ar:O₂=1:9 under $2.0 \times 10^{-3}$ Torr, employing a target of Zn.

Since the Zn film was oxidized into a ZnO film under the oxide atmosphere, the total film thickness of the ZnO film formed on the Ag film was 450 Å. The temperature of the substrate in forming the film was room temperature. The power density of the sputtering was 2.7 W/cm² in forming the ZnO film, and 0.7 W/cm² in forming the Ag film.

A moisture resistance test similar to those in the above Examples was performed on the obtained low emissivity film. Concerning the appearance of the sample after the moisture resistance test, clear white dots having a diameter of 1 mm or more and white turbidity at the peripheral portion of the sample were observed.

In the low emissivity film of this invention, the moisture resistance thereof is considerably improved. Accordingly, it is considered that the handling thereof in a single plate form is facilitated. Furthermore, the possibility of long term storage thereof in room in a single plate form, is realized. Furthermore, this improvement amounts to the promotion of reliability in a low emissivity film for use in an automobile and for use in construction. Furthermore, since the low emissivity film is not deteriorated by the moisture contained in an intermediate film when it is used in a double glazing, the durability of double grazing for use in an automobile, in construction or the like is promoted.

Since the low emissivity film of this invention is provided with metal films, it has electric conductivity as well as the heat ray shielding function. Accordingly, the low emissivity film of this invention is applicable to various technology fields by utilizing the electric conductivity. For instance, in the field of electronics, it can be utilized as an electrode (it can be used in an electrode for a solar cell or the like). Furthermore, it can be used as a heat generating body in an electrically heated window. Or, it can be utilized as an electromagnetic shielding film in a window or in electronic components. Depending on cases, the low emissivity film of this invention can be formed on a substrate interposing a film having various functions. In that case, the optical function thereof can be controlled in accordance with the usage, by selecting optimum film thicknesses of respective films of the low emissivity film of this invention or the like.

What is claimed is:

1. A low emissivity film comprising:
   a substrate and a coating of an oxide film, a metal film, an oxide film and so on alternately formed on said substrate in this order in a total of (2n+1) layers where n is an integer being equal to or more than 1,
   wherein an oxide film (B) formed on the side opposite to a metal film (A) being most remote from said substrate in view from the substrate, contains at least one layer of a zinc oxide film doped with at least one dopant selected from the group consisting of Si, Ti, Cr, B, Mg and Ga by 1 through 10 atomic % with respect to the total amount of dopant and Zn,
   said oxide film (B) formed on the side opposite to a metal film (A) being most remote from the substrate having a thickness of 200 to 700 Å and said metal film having a thickness of 50 to 160 Å.

2. The low emissivity film according to claim 1, wherein the oxide film (B) contains at least one layer of a zinc oxide film doped with at least one dopant selected from the group consisting of Si, Ti, Cr, B, Mg and Ga by 2 through 6 atomic % with respect to the total amount of dopant and Zn.

3. The low emissivity film according to claim 1, wherein the metal film (A) is a metal film whose major component is Ag.

4. The low emissivity film according to claim 1, wherein the crystal structure of the zinc oxide of the zinc oxide film is hexagonal and a value of a diffraction angle 2θ (center of gravity position) of (002) diffraction line of the hexagonal zinc oxide in X-ray diffraction method using CuKα radiation is not smaller than 33.88° and not larger than 35.00°.

5. The low emissivity film according to claim 1, wherein a value of a diffraction angle 2θ (center of gravity position) of (002) diffraction line of a hexagonal zinc oxide of the zinc oxide film in X-ray diffraction method using CuKα radiation is not smaller than 34.00° and not larger than 34.88°.

6. The low emissivity film according to claim 1, wherein at least one layer of oxide films other than the oxide film (B) is a zinc oxide film doped with at least one dopant selected from the group consisting of Si, Ti, Cr, B, Mg and Ga by 1 through 10 atomic % with respect to the total amount of dopant and Zn.

7. The low emissivity film according to claim 1, wherein at least one layer of oxide films other than the oxide film (B) is a zinc oxide film doped with at least one dopant selected from the group consisting of Si, Ti, Cr, B, Mg and Ga by 2 through 6 atomic % with respect to the total amount of dopant and Zn.

8. A low emissivity film according to claim 3,
wherein an integral width $\beta i(°)$ of (111) diffraction line of a cubic Ag in an X-ray diffraction diagram of the low emissivity film exists in a first range of $180\lambda/(d\pi\cos\theta) \leq \beta i \leq 180\lambda/(d\pi\cos\theta)+0.15$,
where d(Å) designates a thickness of a film whose major component is Ag, $\lambda$(Å), a wave length of an X-ray for measurement and $\theta$, Bragg angle.

9. The low emissivity film according to claim 8, wherein the integral width $\beta i(°)$ exists in a second range of $180\lambda/(d\pi\cos\theta) \leq \beta i \leq 180\lambda/(d\pi\cos\theta)+0.10$.

10. The low emissivity film according to claim 8, wherein the integral width $\beta i(°)$ exists in a third range of $180\lambda/(d\pi\cos\theta) \leq \beta i \leq 180\lambda/(d\pi\cos\theta)+0.05$.

11. A low emissivity film according to claim 4,
wherein an integral width $\beta i(°)$ of (111) diffraction line of a cubic Ag in an X-ray diffraction diagram of the low emissivity film exists in a first range of $180\lambda/(d\pi\cos\theta) \leq \beta i \leq 180\lambda/(d\pi\cos\theta)+\mathbf{0.15}$.

12. The low emissivity film according to claim 11, wherein the integral width $\beta i(°)$ exists in a second range of $180\lambda/(d\pi\cos\theta) \leq \beta i \leq 180\lambda/(d\pi\cos\theta)+0.10$.

13. The low emissivity film according to claim 11, wherein the integral width $\beta i(°)$ exists in a third range of $180\lambda/(d\pi\cos\theta) \leq \beta i \leq 180\lambda/(d\pi\cos\theta)+\mathbf{0.05}$.

14. The low emissivity film according to claim 1, wherein a layer being most remote from the substrate among a plurality of layers composing the oxide film (B) is a controlling layer for controlling adhesive strength between the low emissivity film and an intermediate plastic film interposed for lamination with another substrate.

15. The low emissivity film according to claim 1, wherein the dopant is Si.

16. The low emissivity film according to claim 1, wherein the dopant is Ti.

17. The low emissivity film according to claim 1, wherein the dopant is Cr.

18. The low emissivity film according to claim 1, wherein the dopant is B.

19. The low emissivity film according to claim 1, wherein the dopant is Mg.

20. A low emissivity film comprising:
a substrate and a coating of an oxide film, a metal film, an oxide film and so on alternately formed on said substrate in this order in a total of (2n+1) layers where n is an integer being equal to or more than 1,
wherein an oxide film (B) formed on the side opposite to a metal film (A) being most remote from said substrate in view from the substrate, contains at least one layer of a zinc oxide film doped with Sn by 2 through 6 atomic % with respect to the total amount of dopant and zinc, said oxide film (B) formed on the side opposite to a metal film (A) being most remote from the substrate having a thickness of 200 to 700 and said metal film having a thickness of 50 to 160 Å.

21. The low emissivity film according to claim 1, wherein the dopant is Ga.

* * * * *

UNITED STATES PATENT AND TRADEMARK OFFICE
CERTIFICATE OF CORRECTION

PATENT NO.  : 5,532,062
DATED       : JULY 2, 1996
INVENTOR(S) : MASAMI MIYAZAKI ET AL.

It is certified that error appears in the above-identified patent and that said Letters Patent is hereby corrected as shown below:

Column 14, line 32, "A low" should read --A substrate with a low--;

line 49, "The low" should read --The substrate with a low--;

line 54, "The low" should read --The substrate with a low--;

line 57, "The low" should read --The substrate with a low--;

line 63, "The low" should read --The substrate with a low--.

Column 15, line 1, "The low" should read --The substrate with a low--;

line 7, "The low" should read --The substrate with a low--;

line 13, "A low" should read --The substrate having a low--;

line 21, "The low" should read --The substrate with a low--;

UNITED STATES PATENT AND TRADEMARK OFFICE
CERTIFICATE OF CORRECTION

PATENT NO. : 5,532,062

DATED : JULY 2, 1996

INVENTOR(S) : MASAMI MIYAZAKI ET AL.

It is certified that error appears in the above-identified patent and that said Letters Patent is hereby corrected as shown below:

Column 15, line 24, "The low" should read --The substrate with a low--;

line 27, "A low" should read --The substrate having a low--;

line 33, "The low" should read --The substrate with a low--;

line 36, "The low" should read --The substrate with a low--.

Column 16, line 1, "The low" should read --The substrate with a low--;

line 7, "The low" should read --The substrate with a low--;

line 10, "The low" should read --The substrate with a low--;

line 12, "The low" should read --The substrate with a low--;

line 14, "The low" should read --The substrate with a low--;

UNITED STATES PATENT AND TRADEMARK OFFICE
CERTIFICATE OF CORRECTION

PATENT NO. : 5,532,062
DATED : JULY 2, 1996
INVENTOR(S) : MASAMI MIYAZAKI ET AL.

Page 3 of 3

It is certified that error appears in the above-identified patent and that said Letters Patent is hereby corrected as shown below:

Column 16, line 16, "The low" should read --The substrate with a low--;
            line 19, "A low" should read --A substrate with a low--;
            line 34, "The low" should read --The substrate with a low--;

Signed and Sealed this

Fourth Day of March, 1997

*Attest:*

*Attesting Officer*

BRUCE LEHMAN

*Commissioner of Patents and Trademarks*